United States Patent [19]

Radovsky

[11] 3,887,879

[45] June 3, 1975

[54] CURRENT MIRROR

[75] Inventor: Jonathan Samuel Radovsky, Somerville, N.J.

[73] Assignee: RCA Corporation, New York, N.Y.

[22] Filed: Apr. 11, 1974

[21] Appl. No.: 459,952

[52] U.S. Cl. .................... 330/19; 330/17; 330/22; 330/30 D; 330/38 M

[51] Int. Cl. .................... H03f 3/42

[58] Field of Search .......... 330/17, 19, 30 D, 38 M, 330/22

[56] References Cited

UNITED STATES PATENTS

| | | | |
|---|---|---|---|
| 3,660,773 | 5/1972 | Free | 330/38 M X |
| 3,813,607 | 5/1974 | Voorman | 330/19 X |

*Primary Examiner*—R. V. Rolinec
*Assistant Examiner*—Lawrence J. Dahl
*Attorney, Agent, or Firm*—H. Christoffersen; S. Cohen; A. L. Limberg

[57] ABSTRACT

A current mirror amplifier using a first and a second transistors with parallelled base-emitter circuits and collector electrodes connected to input and output terminals, respectively, includes a degenerative collector-to-base feedback connection with high current gain. Accordingly, input and output direct currents can be accurately proportioned without an inaccuracy caused by base current flows. The feedback connection may comprise a cascade connection of a third transistor and a fourth complementary conductivity transistor, each connected in common-emitter amplifier configuration.

7 Claims, 6 Drawing Figures

CURRENT MIRROR

The present invention relates to current amplifiers of the type commonly referred to as "current mirror amplifiers."

Current mirror amplifiers and three-terminal amplifier circuits in which a first and second transistors have their emitter electrodes each connected to the common terminal and their respective collector electrodes connected to the input terminal and to the output terminal, respectively. The first transistor is provided with collector-to-base feedback which regulates the amplitude of its collector current to equal substantially the amplitude of a current supplied or withdrawn via the input terminal. The base-emitter potential of the first transistor is applied to the base-emitter junction of the second transistor to cause its collector current supplied or withdrawn via the output terminal to be proportionally related to the input current (i.e., first transistor collector current) in the ratio of the second transistor transconductance to the first transistor transconductance. In a monolithic integrated circuit, the transconductances of transistors with similar diffusion profiles are proportional to the areas of their base-emitter junctions, so the current gain of the integrated current mirror amplifier can be largely predetermined by the relative geometries of its component transistors.

The accuracy of this predetermination can be strongly influenced by transistor base current flows, however, when the current gains of the transistors in the current mirror amplifier are low (e.g. less than 10). In such instance, the admixture of transistor base currents with the collector current of the first or the second transistor, arising because of the feedback connection, can undesirably influence the current gain of the current mirror amplifier. This problem makes itself especially apparent in the case of current mirror amplifiers using lateral PNP integrated transistor structures.

One may solve this problem by providing for current amplification in the collector-to-base feedback connection, to reduce the amount of current taken from either the input current of the current mirror amplifier in order to support base current flows to the first and second transistors, used in the current mirroring process. The problem is to find a current amplifier which can be direct coupled in the negative feedback connection and at the same time, introduce no appreciable increase in the offset potential required at the input port of the current mirror amplifier. Also, the current amplifier used in the feedback connection must have a current gain characteristic which provides a satisfactory phase margin for the feedback loop it forms with the first transistor, thereby to avoid positive feedback conditions in the current mirror amplifier which may cause it to be self-oscillatory. It is desirable that the current amplifier have at least unity gain to frequencies well beyond the frequencies at which the common-emitter forward current gains of the first and second transistor fall to unity, and at the same time, that the gain of the current amplifier exhibit as little phase shift as possible to maintain phase margin. Finally, the current amplifier should be of a type which does not require a large amount of area when constructed upon a monolithic integrated circuit.

The present invention is embodied in a current mirror amplifier in which the collector-to-base feedback connection of the first transistor comprises a third transistor and a fourth, complementary conductivity transistor. The third transistor is connected in a common-emitter amplifier configuration with its base electrode connected to the input terminal and its collector electrode connected to the base electrode of the fourth transistor. The fourth transistor is connected in a common-emitter amplifier configuration with its collector electrode connected to the joined base electrodes of the first and second transistors. Because of the gain of the common-emitter amplifier configuration including the fourth transistor, the amount of base current which need flow from the third transistor in order that sufficient base currents be withdrawn from the first and second transistors is negligibly small.

IN THE DRAWING

Figure 1:
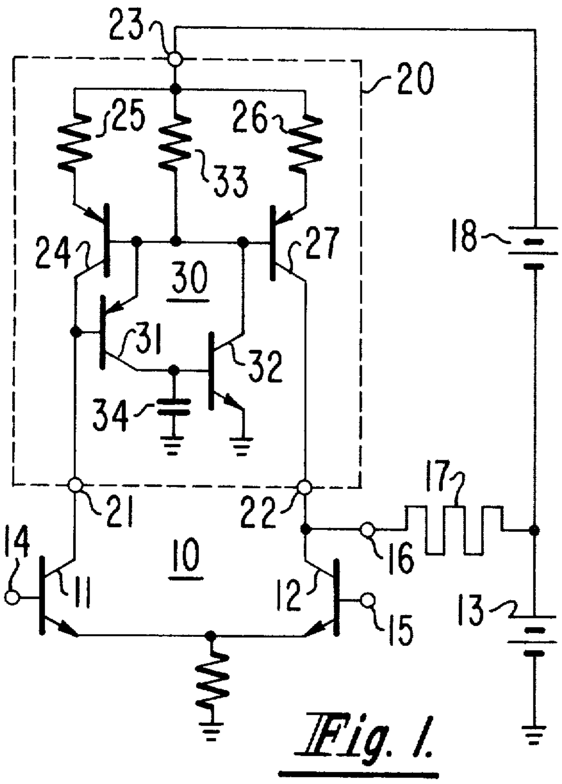
FIG. 1 is a schematic diagram of a current mirror amplifier embodying the present invention, used in a typical application for current mirror amplifiers, an active balun load for an emitter-coupled transistor amplifier.

FIG. 1 shows a differential amplifier 10 wherein a current mirror amplifier 20 is used as the active collector load for a pair of emitter-coupled transistors 11 and 12. An input signal, which may be referred to a bias potential intermediate between the potentials at the negative and positive terminals of a supply 13, is applied between input terminals 14 and 15 of the differential amplifier 10 from sources not shown. Terminals 14 and 15 are connected to the base electrode of transistor 11 and to the base electrode of transistor 12, respectively. The collector currents of transistors 11 and 12 exhibit variations in push-pull relationship to each other responsive to the input signal. Under quiescent conditions, when the input signal is zero-valued and each of the base electrodes is at the same bias potential, the quiescent collector currents of transistors 11 and 12 are equal, assuming transistors 11 and 12 exhibit matched transconductance characteristics.

The current mirror amplifier 20 in this use or application is required to respond to current withdrawn from its input terminal 21 to supply an equal current from its output terminal 22; that is, it is desired that its current gain be minus unity (−1). This requirement is particularly stringent with respect to the direct current gain of amplifier 20, since the desired response to the quiescent collector current of transistor 11 withdrawn from terminal 21 is to supply a current from terminal 22 equal to the similarly valued quiescent collector current demanded by transistor 12. This will, by Kirchoff's Current Law, eliminate any quiescent current flow through output terminal 16 to the resistive load 17. Consequently, by Ohm's Law, no quiescent potential drop will obtain across the resistive load 17, and output terminal 16 will be stably biased at the potential at the joined positive terminal of potential supply 13 and negative terminal of potential supply 18. In a more practical operating environment for the differential amplifier 10, this means that the output terminal 16 can be biased to a potential according to the requirements of the circuits following the differential amplifier 10 without need for that circuitry having to accept a quiescent current remaining from the biasing of the differential amplifier 10.

It is desirable that the current mirror amplifier 20 exhibit minus unity current gain for signal current variations. When it does, the collector current variations of transistor 11 (applied to input terminal 21) results in corresponding variations in the current supplied from terminal 22 of amplifier 20 and these add constructively to the variations in the collector current of a transistor 12 at terminal 22. The result is current flow to the resistive load 17. In other words, the current mirror amplifier 20 then operates as an active balum load for the emitter-coupled differential amplifier transistors 11 and 12, converting the push-pull collector current variations of the amplifier into a single-ended signal current supplied from output terminal 16.

The common terminal 23 of current mirror amplifier 20 is connected to receive an operating potential from the serially connected supplies 13 and 18. Transistor 24 has its collector and emitter electrodes respectively connected to input terminal 21 of current mirror amplifier 20 and to its common terminal 23. The latter of these connections is shown as being by means of a resistor 25, although, as will be explained later, a direct connection can be used instead. The potential between the base electrode of transistor 24 and the common terminal 23 is regulated so that transistor 24 will supply a collector current substantially equal to the collector current demand of transistor 11. This regulation is by means of degenerative collector-to-base feedback being applied to transistor 24, in a manner described hereinafter.

The regulated potential developed between the base electrode of transistor 24 and the common terminal 23 appears not only across the serial connection of the resistor 25 and the base-emitter junction of transistor 24, but also across the serial connection of the resistor 26 and the base-emitter junction of transistor 27. This causes the conduction of current through resistor 26 and the emitter-to-collector path of transistor 27 to be related to the conduction of current through resistor 25 and the emitter-to-collector path of transistor 24. The relationship of the emitter current $I_{E27}$ of transistor 27 to the emitter current $I_{E24}$ of transistor 24 is known to be related to the transconductances $g_{m24}$ and $g_{m27}$ of transistors 24 and 27, relatively, and to the resistances $R_{25}$ and $R_{26}$, of resistors 25 and 26, relatively, as expressed in the following equation:

$$\frac{I_{E27}}{I_{E24}} = \frac{g_{m27} + \frac{1}{R_{26}}}{g_{m24} + \frac{1}{R_{25}}}$$

The proportionality between transconductances $g_{m24}$ and $g_{m27}$ can be accurately scaled with respect to each other in a monolithic integrated circuit by proportioning the effective areas of the base-emitter junctions of transistors 24 and 27. The proportionality between resistances $R_{25}$ and $R_{26}$ can be accurately scaled by proportioning the relative areas of the diffusion or implantations forming the resistors in a monolithic integrated circuit. If $R_{25}$ and $R_{26}$ are zero-valued by reason of resistors 25 and 26 being replaced by direct connection, then:

$$\frac{I_{E27}}{I_{E24}} = \frac{g_{m27}}{g_{m24}}.$$

Presuming the transistors 24 and 27 to have equal current gains, the ratio of the respective collector currents of transistors 27 and 24 is the same as $I_{E27}/I_{E24}$. If the current diverted to the collector-to-base feedback connection 30 of transistor 24 is negligible, this same ratio is the current gain of the current mirror amplifier 20.

The aspects of current mirror amplifier construction presented in the previous two paragraphs are generally known. However, the current mirror amplifier 20 of FIG. 1 differs from the prior art in the collector-to-base feedback connection 30 used to regulate the base potential of transistor 24 relative to potential at common terminal 23. In the prior art, the feedback connection comprised a direct connection or simply an emitter-follower, each of which alternatives may provide too small a current gain, particularly when the transistors 24 and 27 themselves low common-emitter forward current gains (low $h_{fe}$'s). In the present invention, the collector-to-base feedback connection 30 comprises a cascade connection of two common-emitter amplifier transistors, 31 and 32, of opposite and complementary conduction types.

Each of the common-emitter amplifier transistors 31 and 32 provides inverting current gain so the small base current withdrawn from the first common-emitter amplifier in the cascade connection causes a large non-inverted collector current flow to transistor 32. Now, a certain collector current is needed from transistor 24 to provide the current withdrawn from input terminal 21. To support this collector current, a base current of magnitude dependent upon the $h_{fe}$ of transistor 24 must be withdrawn from the base electrode of transistor 24. This base current will be a portion of the output current withdrawn by feedback connection 30, together with the base current of transistor 27 and the current through a collector resistor 33 which comprises the other portions of the output current withdrawn by feedback connection 30. The higher the current gain of the collector-to-base feedback connection 30, the less its input current will affect the current flow through terminal 21 in order to cause the collector current of transistor 24 to supply substantially all of the required current flow to terminal 21.

It is often the case in monolithic integrated circuitry that the common emitter forward current gain, or $h_{fe}$, of a transistor of one conductivity type may be quite low; the $h_{fe}$'s of transistors with lateral PNP structures in a P-substrate integrated circuit, for example, are notoriously low. At the same time, the $h_{fe}$ of a transistor of the other type be relatively high; continuing the example, such is generally true of transistors with vertical NPN structures in P-substrate integrated circuits. With the cascaded common-emitter amplifiers used in feedback connection 30 containing transistors 31 and 32, respectively, of opposite and complementary conductivity types, a shortcoming in $h_{fe}$ in one conductivity type transistor can be compensated for by the higher $h_{fe}$ of the other conductuctivity type transistor. In any case, the overall current gain of the cascade will be the product of the $h_{fe}$'s of transistors 31 and 32. If their $h_{fe}$'s both exceed unity, the current gain of the cascade connection of transistors 31 and 32 will be larger than either of their individual common emitter amplifier gains.

The circuit shown in FIG. 1 shows certain refinements of this underlying idea of using cascade complementary conductivity common-emitter-amplifier transistors in the feedback connection 30. While the common-emitter amplifier transistor 31 might have its emitter electrode connected to common terminal 23 simply by direct connection or resistor or means providing an offset potential, in FIG. 1 it is shown in a bootstrap connection to the collector load (that is, the base input impedances of transistors 24 and 27 and the resistor 33) of transistor 32. This connection is not to gain any advantages insofar as reducing input current to transistor 31, the conventional advantage bootstrapping is used to attain, since here the overall negative feedback connection of transistor 24 and the collector-to-base feedback connection 30 would obviate that advantage if sought. The advantage to be gained is noticed when a capacitor 34 is used to reduce the gain of the cascaded common-emitter transistor amplifiers (the amplifier, with transistors 31, 32) at high frequencies, thus improving the phase margin of the feedback loop comprising transistor 24 and cascaded common-emitter amplifier transistors 31 and 32. The increased phase margin is desired because, as is well known, this greatly increases the stability of the loop against unwanted self-oscillations.

The value of capacitor 34 required is usually only a few picofarads, so it can be integrated by using one of the known techniques. For example, the capacitance of a reverse-biased semi-conductor junction may be used.

Relatively high-frequency variations in the current withdrawn from input terminal 21 will not be coupled through the cascaded common-emitter amplifier action of transistors 31 and 32 to the base-electrode of output transistor 27 when capacitor 34 is used in the FIG. 1 configuration. However, these variations will be coupled from terminal 21 to the base electrode of transistor 27 by the emitter-follower action of transistor 31. That is, at these relatively high frequencies, capacitor 34 provides a low-impedance collector connection for transistor 31 and at the same time by-passes the base drive to transistor 32 required to sustain bootstrapping, which provisions together operate to cause transistor 31 to provide common-collector amplification of these relatively high frequencies. Resistor 33 operates as a pull-up providing a path for discharging stray capacitance at the emitter electrode of transistor 31 during positiveward swings of its emitter potential. There is response to the signal current applied to the input terminal 21, over a wider bandwidth than that available through feedback connection 30, at the interconnection between the base electrodes of transistors 24 and 27.

Whether the collector-to-base feedback of transistor 24 is by means of the common-emitter amplifier actions of transistors 31 and 32 or by means of the emitter follower action of transistor 31, there will be regulation of the potential between the common terminal 23 and the interconnection of the base electrodes of transistors 24 and 27 to condition transistor 24 to supply a collector current which together with the base current of transistor 31 will equal the current withdrawn through input terminal 21. And the potential is applied to the base electrode of transistor 27 will cause a corresponding collector current to that of transistor 24 to be supplied via output terminal 22. The current gain of the current mirror amplifier 20 will be substantially constant over the frequency ranges of each of the two different modes of operation and in the range between where the two modes of operation overlap.

The d-c gain (and the current gain at relatively low frequencies) can be made still more independent of the base currents of transistors 24 and 27 by making transistor 32 a composite transistor with very high current gain (over 1000). For example, a Darlington connection of cascaded NPN transistors can be used instead of a simple NPN transistor. The word "transistor" as used in the claims includes in its definition a composite transistor device. Where a current mirror amplifier is to be used as an active balun load for the collectors of an emitter-coupled transistor amplifier as shown in FIG. 1, if often is more important to reproduce accurately in its output current an exact replica of the direct component of its input current than it is to produce an exact replica of its a-c input signal. Current mirror amplifiers such as amplifier 20 permit this type of need to be filled.

Using the cascaded pair of common-emitter amplifiers in the feedback connection 30 to obtain high current gain, rather than using an alternative high current gain amplifier such as a cascade of common-collector stages, is advantageous in that the exposed configuration does not require any appreciable increase in the quiescent offset potential between input and common terminals 21, 23 in order to obtain improved current mirror operation.

In the FIG. 1 configuration, this quiescent potential needs to be only the sum of the base-emitter offsets of the transistors 24 and 31 plus the potential drop across resistor 25. The potential drop across resistor 25 is customarily less than 0.5 volt and can be eliminated altogether by replacing resistor 25 with a direct (substantially zero resistance) connection. As previously mentioned, the emitter electrode of transistor 31 can alternatively be connected directly to common terminal 23, with some attendent sacrifice of high frequency current mirror amplification. This alternative connection will permit the quiescent potential between terminals 21 and 23 to be reduced to a value just large enough to maintain forward bias of the base-emitter junction of transistor 31.

The quiescent potential required between common terminal 23 and the emitter electrode of transistor 32 to support current mirror amplification is, to close approximation, only the saturation voltage of transistor 32 larger than the quiescent potential required to be maintained between terminals 21 and 23 to support current mirror amplification. If transistor 32 is a compound transistor comprising a Darlington cascade of simple transistors the quiescent potential required between the emitter electrode of transistor 32 and common terminal 23 to support current mirror amplification will be increased somewhat, but there will be no increase between terminals 21 and 23.

In these regards, the current amplifier provided by the cascade connection 30 is superior to a current amplifier comprising a cascade of several PNP common-collector transistors. For one thing the cascade connection of complementary conductivity transistors 31, 32 exhibits better phase-shift characteristics than cascaded PNP transistors, because of wider bandwidth of NPN vertical-structure transistors as compared to PNP lateral-structure transistors. Further, a Darlington connection of simple transistors to form transistor 32 will take up far less area than the cascaded PNP common-collector transistors in an integrated circuit. This is partly because an NPN vertical-structure transistor takes up less area on the integrated-circuit chip than does a PNP lateral-structure transistor. But, also, since the NPN vertical-structure transistor has higher common-emitter forward current gain than the PNP lateral-structure transistor, fewer NPN transistors than PNP transistors are required to achieve a desired value of current gain. Also, the fewer number of NPN transistors required to achieve a value of current gain permits the current amplifier to work with smaller available supply voltages and reduces phase shift through the current amplifier.

As previously mentioned, the emitter electrodes of transistors 24 and 27 may alternatively be connected directly to common terminal 23 rather than by means of resistors 25 and 26. In such instance, pull-up resistor 33 may be replaced by a diode poled to be forward biased by the combined emitter current of transistor 31 and collector current of transistor 32.

In current mirror amplifiers of the same type as amplifier 20, but which are not called upon to amplify signals with frequencies high enough that stray capacitances have appreciable admittance or which only proportion direct currents, pull-up resistor 33 can be omitted. Transistor 31 will not have to deliver appreciable signal currents, since its emitter follower action is not called upon at lower frequencies, so its size can be reduced. This will result in increased bandwidth of response in transistor 31 and permit reduction of the capacitance required of capacitor 34 to obtain adequate phase margin to prevent self-oscillation.

Figure 2:
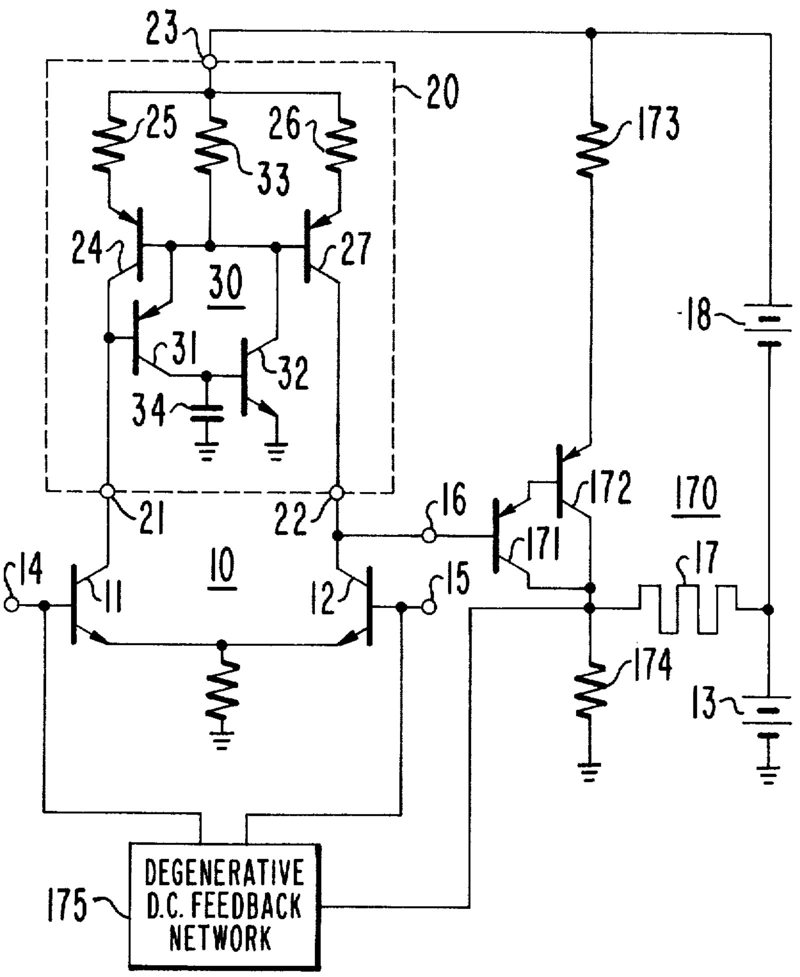
FIG. 2 is a schematic diagram of a current mirror amplifier similar to that of FIG. 1, used to drive succeeding Darlington amplifier stage.

FIG. 2 shows the current mirror amplifier 20 supplying its output signal to a succeeding amplifier 170 prior to being applied to the load 17, which is preferred method for loading the differential amplifer 10. Amplifier 170 comprises a Darlington cascade of transistors 171 and 172, an emitter degeneration resistor 173, a collector resistor 174 and a degenerative direct-coupled feedback network 175. The degenerative direct-coupled feedback network 175 may have outputs to either or both of the input terminals 14 and 15 and can be used to maintain the combined quiescent collector currents of transistors 171 and 172 in fixed proportion with the quiescent collector currents of transistors 24 and 27. This permits the resistance of resistor 173 to be chosen so a potential drip is maintained thereacross which is equal to that appearing across emitter degeneration resistors 25 and 26. Accordingly, the quiescent potential at terminal 21 (which is lower than the potential at terminal 23 by the sum of the potential drop across resistor 25 and the combined base-emitter offset potentials of transistors 24 and 31) is made equal to the quiescent potential at terminal 22 (which is lower than the potential at terminal 23 by the sum of the potential drop across resistor 173 and the combined base-emitter offset potentials of transistors 171 and 172). This causes the quiescent collector potentials of differential amplifier transistors 11 and 12 to be equal when their quiescent collector currents are equal. This eliminates a source of input offset error potential and of drift therein which might otherwise appear between the base electrodes of transistors 11 and 12. The Darlington cascade of transistors 171, 172 loads terminal 16 very lightly and does not appreciably affect the equality of the quiescent collector currents of transistors 11 and 12 which current mirror amplifier 20 attempts to establish.

If emitter degeneration resistors 25 and 26 are replaced by direct connections, the potential at terminal 22 can be maintained the same as that at terminal 21 by also replacing resistor 173 with a direct connection. This similarity of potential will then obtain in the absence of emitter degeneration resistors 25, 26 and 173 even without the aid of degenerative direct coupled feedback network 175. This is because of the potential regulating action of the base-emitter junctions of transistors 24 and 31 in establishing the potential offset between terminals 23 and 21, and because of the potential regulating action of the base-emitter junctions of transistors 171 and 172 in establishing the potential offset between terminals 23 and 22.

Figure 3:
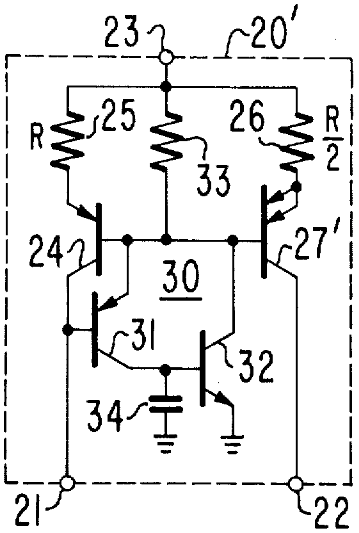
FIGS. 3 and 4 show current mirror amplifiers having current gains of −2 and −½, respectively, each embodying the present invention.

FIG. 3 shows a current mirror amplifier 20' differing slightly in structure from amplifier 20 so as to have a current gain of −2. The current gain of −2 depends upon the fact that a potential appearing across the serial connection of resistor 25 and the emitter-base junction of transistor 24 by feedback connection 30 is the same as that appearing across the serial connection of resistor 26 and the parallelled emitter-base junctions of transistor 27'. This potential is maintained by feedback connection 30 regulating the collector current of transistor 24 to equal a current withdrawn from terminal 21 (by means not shown). The emitter-base junctions of transistor 27' are each like the emitter-base junction of transistor 24; and the resistance, R/2, of resistor 26 is half the resistance, R, of resistor 25. So, the serial connection of resistor 26 and the parallelled emitter-base junctions of transistor 27' has half the resistance of the serial connection of resistor 25 and the emitter-base junction of transistor 24. By Ohm's Law, then the combined emitter currents of transistors 27' are twice as large as that of transistor 24. Since transistors 24 and 27' are similar in type except for the extra emitter-base junction their common-base current gains ($h_{fe}$'s or $\alpha$'s) are equal. Therefore, since the combined emitter currents of transistor 27' and the emitter current of transistor 24 are in 2:1 ratio so will the collector currents of transistors 27' and 24 be in 2:1 ratio.

The collector current of transistor 27' can be made to be any multiple of the collector current of transistor 24 in this same way—that is, by making the total emitter-base junction area of transistor 27' *m* times as large as that of transistor 24 and by making the resistance of resistor 25 *m* times as large as that of resistor 26. Equivalent or similar circuits using parallelled transistors 27 or a transistor 27 with a single emitter-base junction of larger area than that of transistor 24 are also possible.

Figure 4:
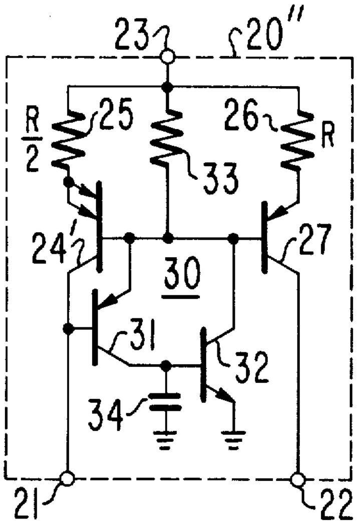

FIG. 4 shows a current mirror amplifier 20'' differing slightly in structure from amplifier 20 so as to have a current gain of −½. The same current proportioning technique used in current mirror amplifier 20' is used in amplifier 20'', except it is applied differently. In amplifier 20'', transistor 24' has a pair of emitter-base junctions each like the emitter-base junctions of transistor 27; and resistor 25 has a resistance R/2 half as large as the resistance R of resistor 26. Current mirror amplifiers similar to amplifier 20'' and with current gains of −1 /*m* can be construed with transistor 24' having *m* emitter-base junctions like that of transistor 27 and with the resistance of resistor 25 being −1/*m* times as large as that of transistor 26. Equivalent or similar circuits using parallelled transistors 24 or a transistor 24 with a single emitter-base junction of larger area than that of transistor 27 are also possible.

Figure 5:
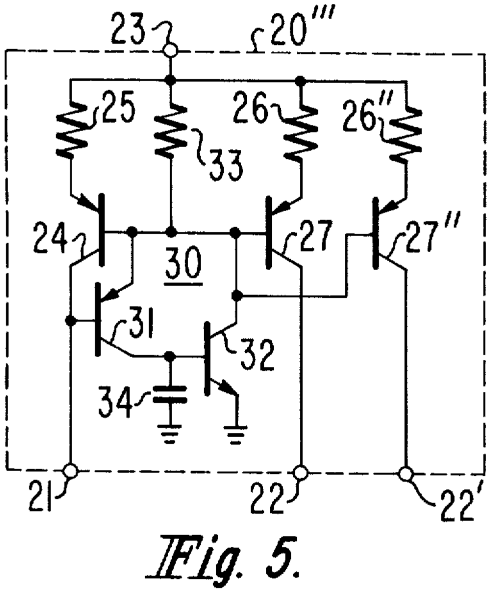
FIG. 5 shows a current mirror amplifier having a plurality of output ports and embodying the present invention.

FIG. 5 shows a current mirror amplifier 20''' having, in addition to output terminal 22, another output terminal 22' connected to the collector electrode of a transistor 27'' biased similarly to transistor 27. Similar circuits with a multiplicity of outpout terminals are also possible. Further, the proportioning techniques used in amplifiers 20' and 20'' can be used in a current mirror amplifier with a plurality of output terminals.

Now, configurations of the sort described in connection with FIG. 3, 4 and 5 can be operated with closely defined, predetermined current gains when the feedback connection 30 employs cascaded common-emitter amplifiers in accordance with the present invention. Where *m* is large, in configuration like current mirror amplifiers 20', 20'', and 20''', the value of the combined base currents of the *m*+1 emitter base junctions can approach the value of the collector current of one of transistors 24 and 27 when their $h_{fe}$'s are low (e.g., between 1 and 10).

In the prior art current mirror amplifier configurations, where these base currents are combined with one or the other of the collector currents corresponding respectively to the input current and to the output current of the current mirror amplifier, the current gain of the amplifier is strongly affected by those base currents. Proportioning the input and output currents by relying upon the relative transconductances of the transistors will not result in accurately predetermined current gains in these prior art current mirror amplifiers. In current mirror amplifiers which like 20' or 20'', employ the feedback connection 30 of the present invention, the combined base currents of transistors 24 and 27' or 24' and 27 are provided by the collector current of transistor 32 and because of the high current gain of the cascaded transistors 31 and 32, the base current of transistor 31 will be negligible compared to the collector current of transistor 24 or 24'. Therefore, the current gains of current mirror amplifiers like 20' and 20'' which employ a feedack connection using cascaded common-emitter amplifier, are not appreciably affected by a problem arising from base current flows.

In a configuration like current mirror amplifier 20''', the combined base currents of transistor 24 and of the plurality of output transistors (27, etc.) can approach the value of the collector current of transistor 24 when their $h_{fe}$'s and that of transistor 24 are low (e.g., between 1 and 10) and/or when there is a large number of output transistors (27, etc.). Adding these combined base currents to the input current of the current mirror amplifier, as done in prior art circuits, seriously affects the proportioning of the output currents with respect to the input current. In current mirror amplifiers like 20''', using cascaded common-emitter amplifiers in their feedback connection 20, the combined base currents of transistor 24 and the output transistors (27, etc.) are provided by the collector current of transistor 32. Because of the high current gain of the cascaded transistors 31 and 32, the base current of transistor 31 will be negligible compared to the collector current of transistor 24. Therefore, the current gains of current mirror amplifiers like 20''' are not appreciably affected by a problem arising from base current flows.

Figure 6:
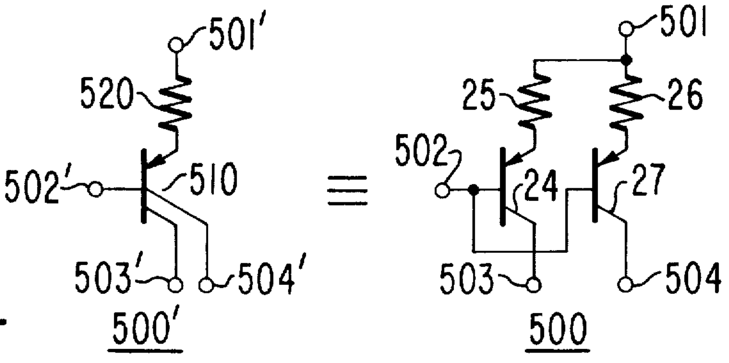
FIG. 6 is a pair of circuit diagrams illustrating the known equivalence of a dual collector transistor to a pair of transistors connected emitter-to-emitter and base-to-base with each other.

FIG. 6 shows the subcombination 500 comprising elements 24, 25, 26 and 27 used in FIG. 1 and also shows an equivalent circuit 500' which can replace the subcombination 500. This equivalent circuit 500' comprises a dual-collector transistor 510 provided with emitter degeneration resistor 520 having a conductance equal to the sum of the conductances of resistors 25 and 26. The base electrode of the dual-collector transistor 510 is connected to a terminal 502' which corresponds to the terminal 502 connected to the base-to-base connection of transistors 24 and 27 in the subcombination 500. Similarly, terminals 501', 503' and 504' of the equivalent circuit 500' correspond electrically to terminals 501, 503 and 504 of subcombination 500. The alternative configuration 500' will often appear when lateral structure transistors are to be used in the current mirror amplifier, since it is relatively simple to surround the emitter region, which is implanted in the base region of the lateral transistor, with a plurality of collector regions. In determining the scope of the following claims a dual collector transistor is to be considered as a pair of transistors connected base-to-base and emitter-to-emitter.

What is claimed is:

1. A current amplifier comprising:

an input terminal, an output terminal and a common terminal;

first and second and third transistors of a first conductivity type and a fourth transistor of a second conductivity type complementary to said first conductivity type, each transistor having base and emitter and collector electrodes, the emitter electrodes of said first and said second transistors being direct current conductively coupled to said common terminal, the collector electrodes of said first and said second transistors being direct current conductively coupled respectively to said input terminal and to said output terminal, the base electrode of said third transistor having said input terminal direct coupled thereto, the emitter electrode of said third transistor having the base electrodes of said first and said second transistors coupled thereto; the collector electrode of said third transistor being direct coupled to the base electrode of said fourth transistor, the collector electrode of said fourth transistor being direct coupled to said first transistor base electrode and to said second transistor base electrode; and means connected to the emitter electrode of said fourth transistor for biasing said fourth transistor for common-emitter amplification.

2. A current amplifier as set forth in claim 1 having a capacitor connected between said third transitor collector electrode and a point of direct potential as referred to said common terminal.

3. A current amplifier as set forth in claim 1 wherein a resistive element is connected from said common terminal to said joined base electrodes of said first and said second transistors.

4. A current amplifier as set forth in claim 3 having a capacitor connected between said third transistor collector electrode and a point of direct potential as referred to said common terminal.

5. A current amplifier as set forth in claim 1 having in combination therewith:

a fifth and a sixth transistors of said second conductivity type, each having a base and an emitter and a collector electrodes; and means for connecting said fifth and said sixth transistors as an emitter-coupled differential amplifier including the connection of their respective collector electrodes one to said input terminal of said current mirror ampifier and the other to said output terminal of said current mirror amplifier.

6. The combination set forth in claim 5 having in further combination therewith:

a seventh and an eighth transistors of said first conductivity type, each having a base and an emitter and a collector electrodes; and means for connecting said eighth transistor in Darlington cascade after said seventh transistor including said seventh transistor base electrode being connected to said current amplifier output terminal and said eighth transistor emitter electrode being connected to said current amplifier common terminal.

7. A current amplifier comprising:

an input terminal, a common terminal and an output terminal;

first and second and third transistors of a first conductivity type and a fourth transistor of a second conductivity type complementary to the first, each transistor having base and emitter and collector electrodes, the emitter electrodes of said first and said second transistors being connected to said common terminal, the collector electrodes of said first and said second transistors being connected respectively to said input terminal and to said output terminal;

means for connecting said fourth transistor in a common-emitter amplifier configuration including a connection of its collector electrode to the base electrodes of said first and said second transistors;

means for connecting said third transistor in a common-emitter amplifier configuration including connection of its base electrode to said input terminal and of its collector electrode to the base electrode of said fourth transistor; and a capacitor connected between said third transistor collector electrode and a point of direct potential as referred to said common terminal.

* * * * *